US011658121B2

(12) United States Patent
Sugioka et al.

(10) Patent No.: US 11,658,121 B2
(45) Date of Patent: May 23, 2023

(54) SEMICONDUCTOR DEVICE AND METHOD OF FORMING THE SAME

(71) Applicant: MICRON TECHNOLOGY, INC., Boise, ID (US)

(72) Inventors: Shigeru Sugioka, Higashihiroshima (JP); Hidenori Yamaguchi, Higashihiroshima (JP); Noriaki Fujiki, Kawanishi (JP); Keizo Kawakita, Higashihiroshima (JP)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 16/885,026

(22) Filed: May 27, 2020

(65) Prior Publication Data

US 2021/0375778 A1 Dec. 2, 2021

(51) Int. Cl.

| | |
|---|---|
| ***H01L 23/532*** | (2006.01) |
| ***H01L 23/528*** | (2006.01) |
| ***H10B 12/00*** | (2023.01) |

(52) U.S. Cl.

CPC .... *H01L 23/53295* (2013.01); *H01L 23/5283* (2013.01); *H10B 12/0335* (2023.02); *H10B 12/31* (2023.02)

(58) Field of Classification Search

CPC ....... H01L 21/78; H01L 24/05; H01L 23/544; H01L 23/585; H01L 23/562; H01L 23/53295; H10B 12/0335; H10B 12/31

See application file for complete search history.

(56) References Cited

U.S. PATENT DOCUMENTS

| | | | | |
|---|---|---|---|---|
| 10,685,883 | B1 * | 6/2020 | Wei | H01L 21/78 |
| 2005/0269702 | A1 * | 12/2005 | Otsuka | H01L 23/522 257/E21.582 |
| 2015/0371958 | A1 * | 12/2015 | Tomita | H01L 27/14612 257/432 |
| 2017/0256464 | A1 * | 9/2017 | Naito | H01L 29/66348 |
| 2019/0164915 | A1 * | 5/2019 | Kim | H01L 21/78 |

* cited by examiner

*Primary Examiner* — Jaehwan Oh
*Assistant Examiner* — John M Parker
(74) *Attorney, Agent, or Firm* — Dorsey & Whitney LLP

(57) ABSTRACT

A semiconductor device includes a semiconductor substrate; a first insulating film and a second insulating film provided above the semiconductor substrate; a low-k film provided between the first insulating film and the second insulating film; an element formation region in which elements included in an electric circuit are formed in the semiconductor substrate; a scribe region provided around the element formation region; a cut portion provided on the outer periphery of the scribe region; and a groove formed between the cut portion and the element formation region, wherein the groove penetrates through the low-k film.

14 Claims, 16 Drawing Sheets

E
3 2 3
30 60 6 6 28 26 24 22 20 18 61 16 14 12 10 17 61

SEMICONDUCTOR DEVICE AND METHOD OF FORMING THE SAME

BACKGROUND

For example, in a semiconductor device such as dynamic random-access memory (hereinafter referred to as DRAM), a low-k film having a low dielectric constant between metal interconnects is provided in some cases to reduce the capacitance between interconnects and achieve high-speed operation of the electric circuit.

However, whereas in the past $SiO_2$ has been used as an interlayer film for Cu interconnects and $Si_3N_4$ has been deposited above the Cu interconnects to prevent the diffusion of Cu, recently SiOC and SiCN for example are being used as films having an even lower dielectric constant. In the following description, SiOC and SiCN are collectively referred to as low-k films. These low-k films have lower adhesion than silicon oxide films and silicon nitride films, furthermore, the material is brittle. For these reasons, when a semiconductor wafer on which semiconductor elements such as DRAM are formed is diced to separate the semiconductor wafer into individual semiconductor chips, cracks produced by dicing sometimes propagate in the low-k film and the film interface ($SiO_2$/SiOC, SiOC/SiCN, SiCN/$SiO_2$) and reach the element formation region of the semiconductor device, thereby reducing the yield of the semiconductor device.

BRIEF DESCRIPTION OF THE DRAWINGS

FIG. 48 is a longitudinal section illustrating one example of a schematic configuration of a peripheral circuit part of the semiconductor device according to the first embodiment.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

First Embodiment

Figure 1:
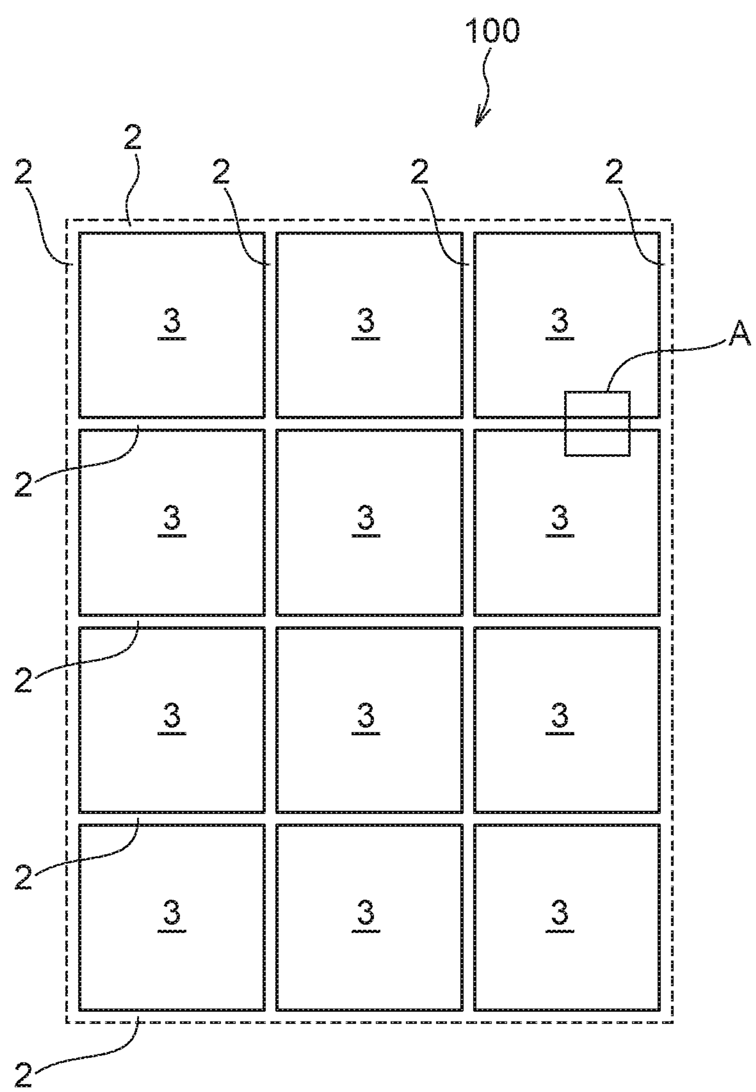
FIG. 1 is a plan view illustrating one example of a schematic configuration of the layout of a semiconductor device according to a first embodiment.

The first embodiment will be described with reference to FIGS. 1 to 3, FIGS. 4A and 4B, FIG. 5, FIG. 6, and FIGS. 7A and 7B. In the following description, DRAM is given as an example of the semiconductor device. FIG. 1 is a plan view illustrating a schematic configuration of the layout of a plurality of element formation regions 3 and a scribe region 2 formed on a semiconductor wafer 100.

The semiconductor wafer 100 illustrated in FIG. 1 is illustrated in the state before the semiconductor wafer is cut by a dicing step, or other words, the state before the semiconductor wafer is separated into individual semiconductor chips. In the semiconductor wafer 100, the plurality of element formation regions 3 have rectangular shapes, and are arranged in a matrix. In the element formation regions 3, transistors forming DRAM are disposed, or alternatively, circuit elements such as conductive interconnects are formed. The scribe region 2 is disposed around each of the element formation regions 3.

Figure 2:
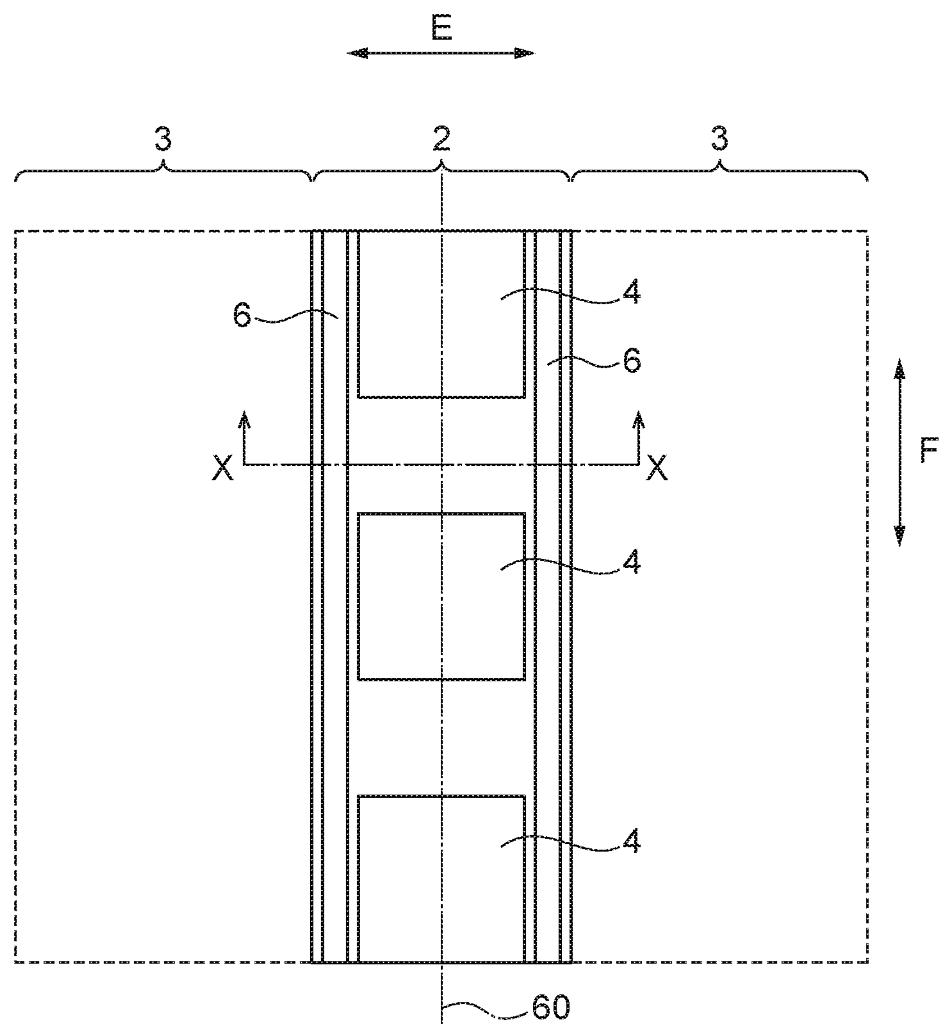
FIG. 2 is a plan view illustrating one example of a schematic configuration of a scribe region of the semiconductor device according to the first embodiment.
Figure 7A:
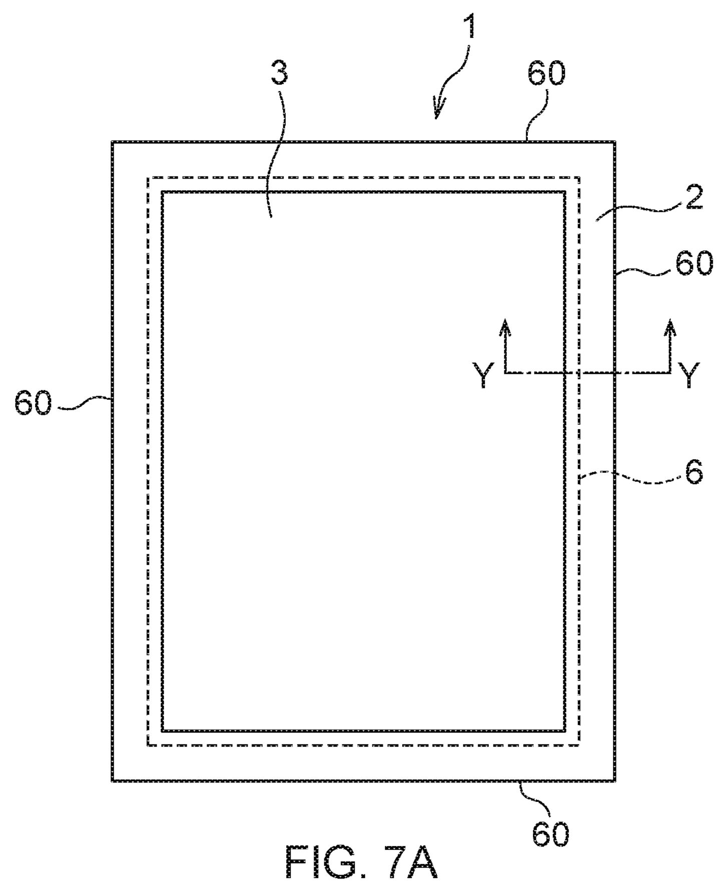
FIG. 7A is a plan view illustrating one example of a schematic configuration of a semiconductor device.
Figure 7B:
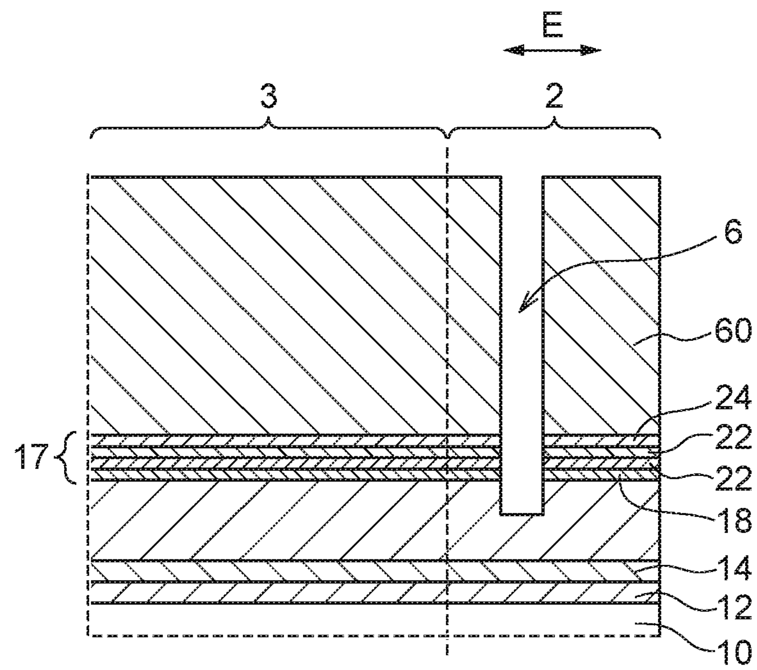
FIG. 7B is a longitudinal section illustrating one example of a schematic configuration of a portion along the line Y-Y in FIG. 7A.

The scribe region 2 corresponds to a cutting region for separating the semiconductor wafer 100 into individual semiconductor devices 1 like the one illustrated in FIG. 7A. As illustrated in FIG. 2, the direction spanning the width of the scribe region 2 is referred to as the width direction E. The scribe region 2 is provided with a predetermined width defining the width direction E. The scribe region 2 extends in a direction orthogonal to the width direction E. In the scribe region 2, the direction at a right angle to the width direction E is referred to as the longitudinal direction F.

Figure 3:
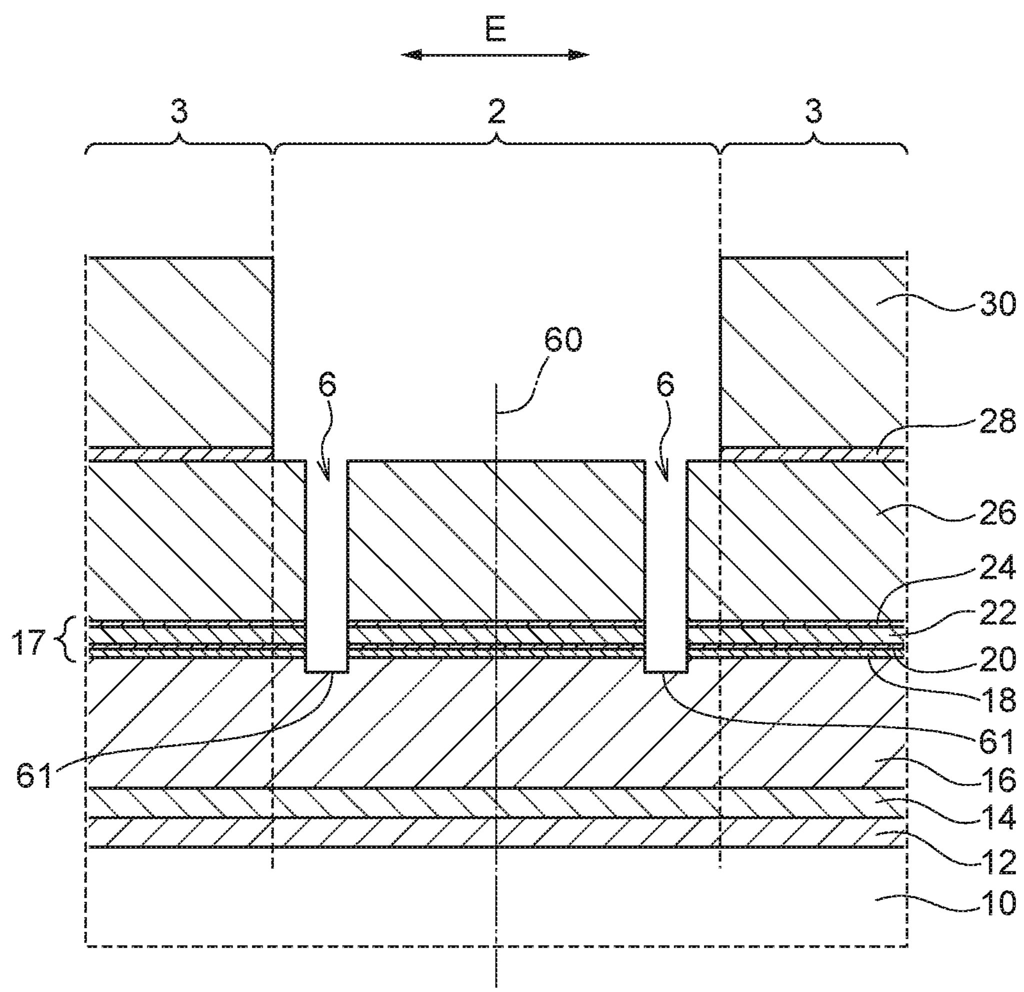
FIG. 3 is a longitudinal section illustrating one example of a schematic configuration of the scribe region of the semiconductor device according to the first embodiment.

In FIG. 3, a cut portion 60 is illustrated in a central part of the scribe region 2. The cut portion 60 is formed in a later dicing step. The cut portion 60 is formed in the approximate center of the scribe region 2.

FIG. 2 is an enlarged view of the region A in FIG. 1, and is a diagram illustrating one example of a schematic configuration of the scribe region 2 exemplified in the first embodiment. FIG. 2 is a plan view. FIG. 3 is a longitudinal section of the portion along the line X-X in FIG. 2.

As illustrated in FIG. 2, electrode pads 4 are provided in the scribe region 2. The scribe region 2 is provided with test element groups (hereinafter referred to as TEGs) for measuring properties such as the electrical characteristics of the manufactured semiconductor devices 1. The electrode pads 4 are electrically connected to the TEGs. During a measurement of a TEG, the electrical characteristics of the TEG are measured by causing a measuring probe connected to a measuring instrument to abut the electrode pads 4. The electrode pads 4 contain a conductive material. For example, the electrode pads contain a metal such as aluminum (Al). The electrode pads 4 may also contain a barrier metal provided above and below a metal electrode.

As illustrated in FIG. 2, in the scribe region 2 provided between the element formation regions 3, a groove 6 is positioned near the ends in the width direction E of the scribe region 2, and is provided extending linearly in the longitudinal direction F of the scribe region 2. The groove 6 is disposed on the outer sides in the width direction E of the electrode pads 4. The position of the groove 6 is decided in consideration of misalignment of the cut portion 60 in the dicing step, for example. The groove 6 is disposed at the ends of the scribe region 2 at position close to the element formation regions 3, such that the cut portion 60 is not positioned closer toward the element formation regions 3 than the groove 6.

As illustrated in FIG. 3, in the scribe region 2 and the element formation regions 3, an insulating film 12, an insulating film 14, a first insulating film 16, a low-k film 17, a second insulating film 26, and a third insulating film 28 are stacked on a semiconductor substrate 10 in the above order proceeding upward from the semiconductor substrate 10. The low-k film 17 is provided between the first insulating film 16 and the second insulating film 26. Herein, a low-k film means a film having a lower dielectric constant (k) than a silicon oxide film used between Cu interconnects and a silicon nitride film that is deposited on the Cu interconnects to prevent Cu diffusion.

As illustrated in FIG. 3, the groove 6 is formed such that the cross-section is a rectangle with an open top. The groove 6 penetrates through the low-k 17, and a bottom 61 of the groove 6 is formed to be positioned below the low-k film 17. The bottom 61 may also be formed with round curvature. In the scribe region 2, the low-k film 17 is divided by the groove 6 so as to be discontinuous in the width direction E of the scribe region 2. The groove 6 is disposed closer to the element formation regions 3 than the cut portion 60. The low-k film 17 is disposed between the cut portion 60 and the element formation regions 3.

In the first embodiment, the low-k film 17 is a stacked film containing a first low-k film 18, a second low-k film 20, a third low-k film 22, and a fourth low-k film 24. The first low-k film 18 and the third low-k film 22 contain a carbon-doped silicon oxide film (SiOC film) for example. The second low-k film 20 and the fourth low-k film 24 are films capable of preventing the diffusion of Cu, and contain a nitrogen-doped silicon carbide film (SiCN film) for example. SiOC and SiCN are given as examples, and some other low-k material having a low dielectric constant can be used as the low-k film 17. Also, the low-k film 17 is not necessarily limited to the above configuration, and may also be a stacked film containing even more low-k films. The above film configuration is described as being similar in the second to fifth embodiments described later.

Figure 4A:
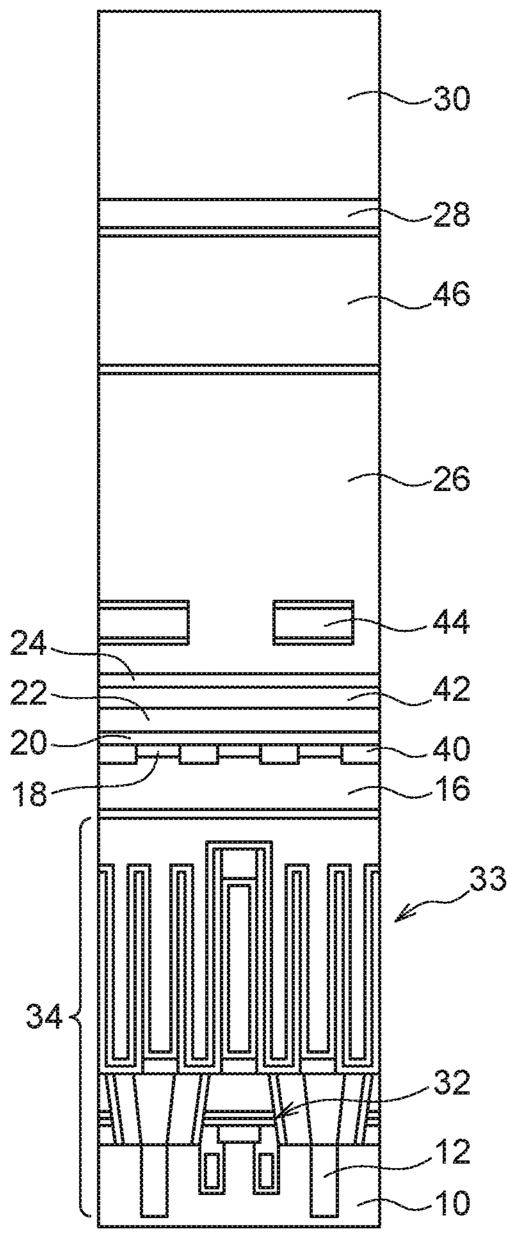
FIG. 4A is a longitudinal section illustrating one example of a schematic configuration of a memory cell region of the semiconductor device according to the first embodiment.
Figure 4B:
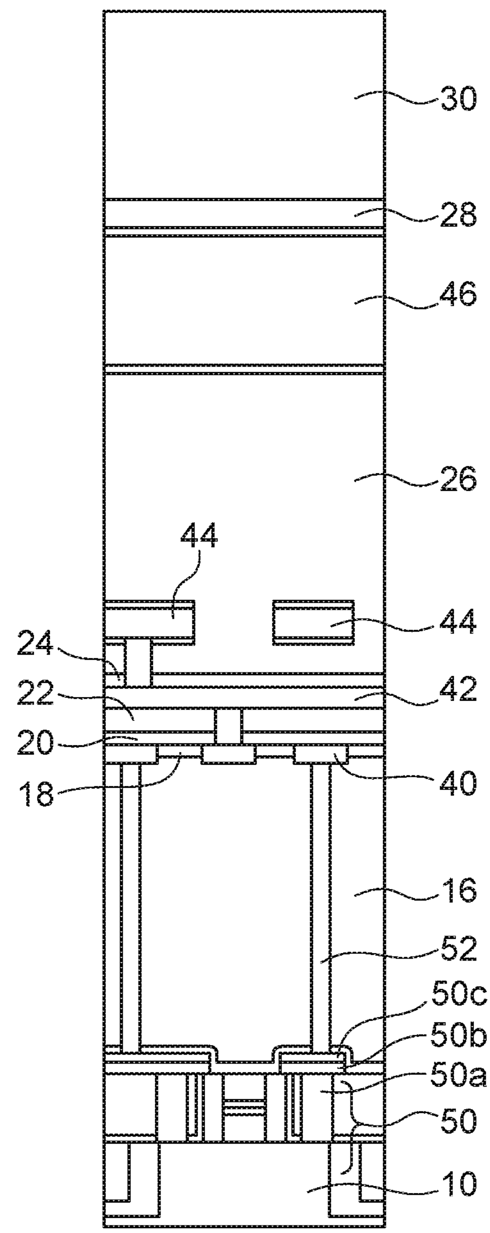

FIG. 4A is a longitudinal section illustrating one example of a schematic configuration of a memory cell region of the DRAM in one of the element formation regions 3. FIG. 4B is a longitudinal section illustrating one example of a schematic configuration of a peripheral circuit region of the DRAM in one of the element formation regions 3. As illustrated in FIGS. 4A and 4B, the element formation region 3 is provided with various elements and conductive interconnects forming the DRAM.

In FIG. 4A, components such as the insulating film 12, a memory element 34, the first insulating film 16, a first metal interconnect 40, a second metal interconnect 42, the low-k films 18, 20, 22, and 24, a third metal interconnect 44, the second insulating film 26, an upper interconnect 46, the third insulating film 28, and a polyimide film 30 are provided on the semiconductor substrate 10. The low-k films 18, 20, 22, and 24 are provided between, alongside, below, and above the first metal interconnect 40 and the second metal interconnect 42. The memory element 34 includes components such as a select transistor 32 and a capacitor 33.

In FIG. 4B, components such as the insulating film 12, a peripheral circuit transistor 50, a contact 50*a*, a metal film 50*b*, a metal film 50*c*, a connecting electrode 52, the first insulating film 16, the first metal interconnect 40, the second metal interconnect 42, the low-k films 18, 20, 22, and 24, the third metal interconnect 44, the second insulating film 26, the upper interconnect 46, the third insulating film 28, and the polyimide film 30 are provided on the semiconductor substrate 10. The low-k films 18, 20, 22, and 24 are provided between and alongside the first metal interconnect 40 and the second metal interconnect 42. The peripheral circuit transistor 50 is electrically connected to the first metal interconnect 40 through the contact 50*a*, the metal film 50*b*, the metal film 50*c*, and the connecting electrode 52.

Note that in the scribe region 2, because the second metal interconnect 42 and the third metal interconnect 44 are not provided, the low-k films 18, 20, 22, and 24 are stacked to form the low-k film 17, as illustrated in FIG. 3 and the like.

The first insulating film 16 is an interlayer insulating film disposed between the memory element 34 and the peripheral circuit transistor 50, and the first metal interconnect 40. The second insulating film 26 is an interlayer insulating film disposed between the third metal interconnect 44 and the upper interconnect 46.

Figure 5:
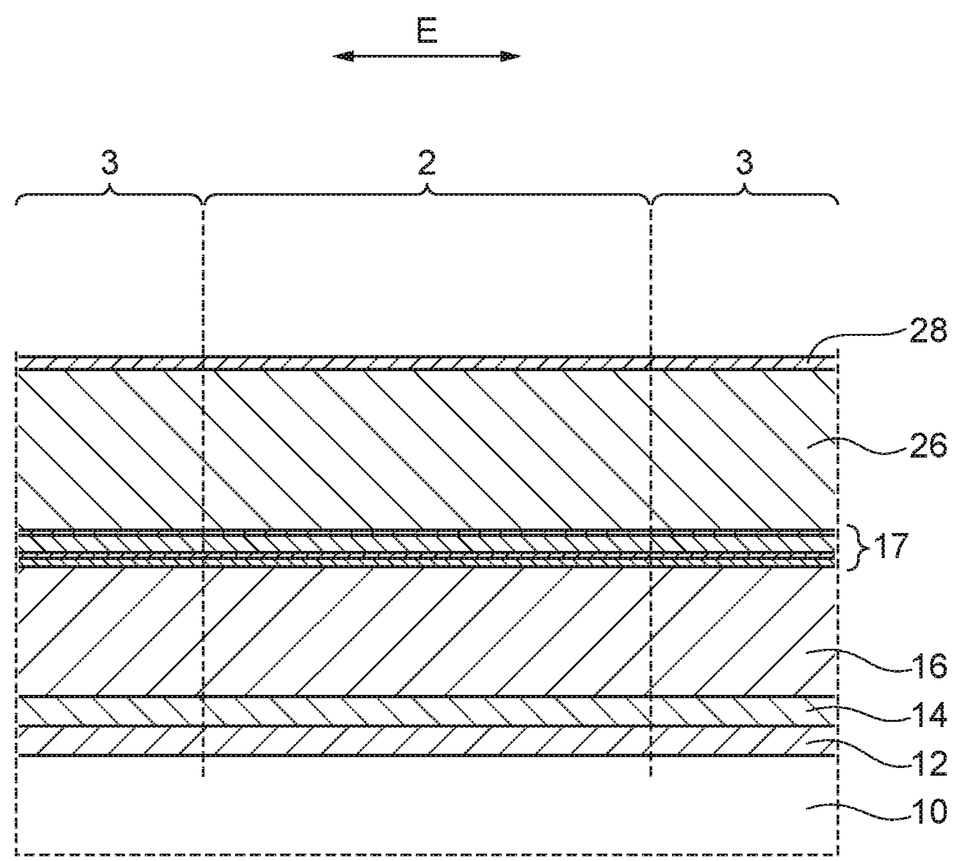
FIG. 5 is a longitudinal section illustrating one example of a step partway through a method of manufacturing the semiconductor device according to the first embodiment.

Next, a method of manufacturing the semiconductor device 1 according to the first embodiment will be described with reference to FIGS. 5, 6, and 3. First, as illustrated in FIG. 5, the insulating film 12, the insulating film 14, the first insulating film 16, the low-k film 17, the second insulating film 26, and the third insulating film 28 are formed on the semiconductor substrate 10. Because the low-k film 17 is a stacked film of the low-k films 18, 20, 22, and 24, and because the low-k film 17 is formed between the metal interconnects 40, 42, and 44 in the element formation regions 3, in actuality, a step of forming the metal interconnects 40, 42, and 44 is also performed.

For the semiconductor substrate 10, a monocrystalline silicon substrate can be used, for example. The insulating film 12, the insulating film 14, the first insulating film 16, and the second insulating film 26 are silicon oxide films, for example. These silicon oxide films may also contain a substance such as phosphorus or boron. The third insulating film 28 is a silicon nitride film, for example. In FIG. 5, the low-k film 17 includes a stacked film of the low-k films 18, 20, 22, and 24. These films are formed by chemical vapor deposition, for example. As illustrated in FIG. 5, the element formation regions 3 in which components such as a DRAM memory cell and a peripheral circuit are formed are disposed on either side of the scribe region 2.

Figure 6:
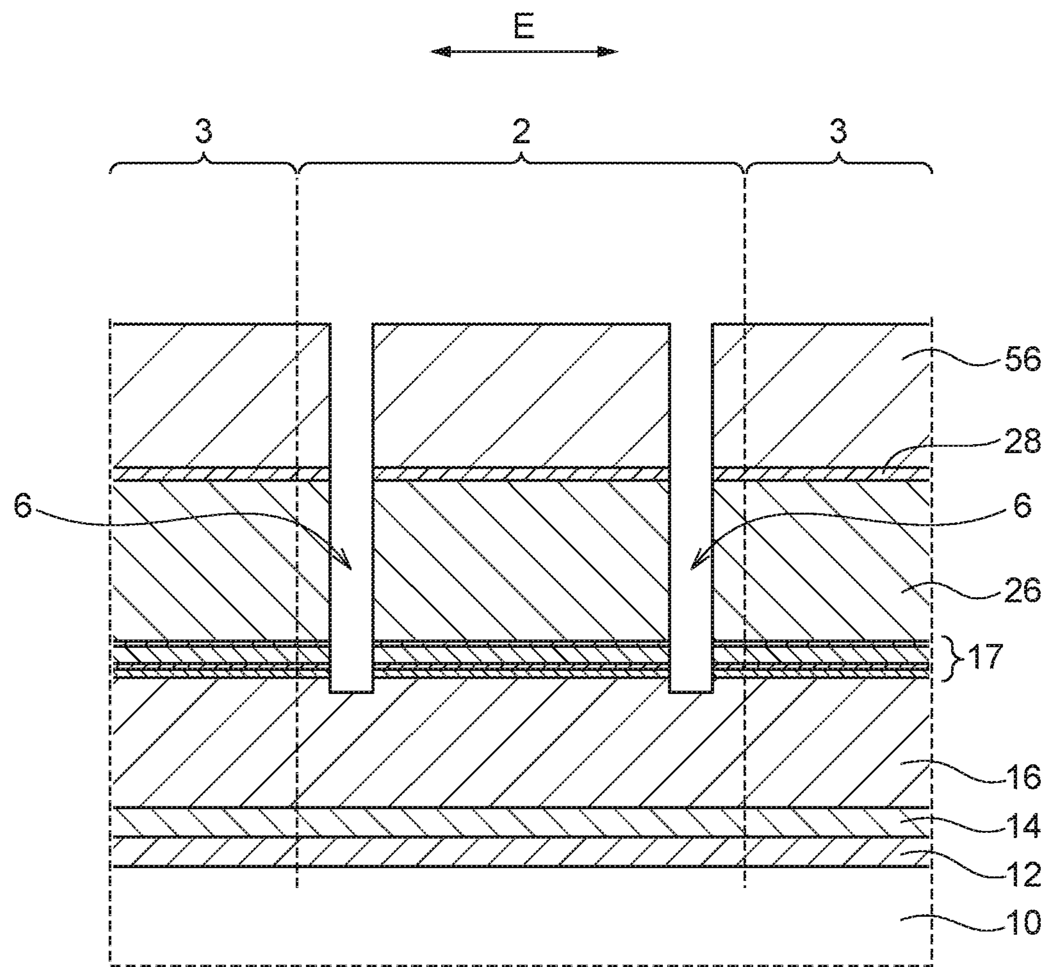
FIG. 6 is a longitudinal section illustrating one example of a step partway through a method of manufacturing a semiconductor device according to the first embodiment, and is a diagram illustrating one example of a step following FIG. 5.

Next, as illustrated in FIG. 6, a photoresist 56 patterned to leave open space above the formation region of the groove 6 is formed. Next, anisotropic dry etching is performed by using the photoresist 56 as a mask. With this arrangement, the third insulating film 28, the second insulating film 26, the low-k film 17, and a portion of the first insulating film 16 are successively etched away, and the groove 6 is formed. The depth of the groove 6 can be controlled by setting an appropriate etching time, for example. The depth of the groove 6 can also be controlled by deciding when to stop etching by monitoring changes in the composition of the etching reaction gas, for example.

Next, as illustrated in FIG. 3, the photoresist 56 is removed, and after that, the polyimide film 30 patterned to leave open space above the scribe region 2 is formed. Next, dry etching is performed by using the polyimide film 30 as a mask, thereby removing the third insulating film 28 in the scribe region 2. At this time, in the element formation regions 3, a space for a bonding pad portion (not illustrated) is formed by removing the third insulating film 28 in the bonding pad portion. The polyimide film 30 is provided as a cover film for protecting the surface of the semiconductor device 1. Next, in the scribe region 2, a dicing step is performed using blade dicing, stealth dicing, or some other dicing method, and the semiconductor substrate 10 is cut. According to the above, individually separated semiconductor devices 1 like the one illustrated in FIG. 7A can be manufactured. After that, although not illustrated in the diagrams, each semiconductor device 1 can be assembled in a package to manufacture a semiconductor product ready for commercial distribution.

The semiconductor devices 1 are cut in the approximate center of the scribe region 2. The area that is cut becomes the cut portion 60. The edges of each semiconductor device 1 are the cut portion 60. In each semiconductor device 1, the scribe region 2 is provided around one of the element formation regions 3. In each semiconductor device 1, the groove 6 is disposed between the cut portion 60 and the element formation region 3. The cut portion 60 defines the outline of the semiconductor device 1.

According to the first embodiment described above, the following effects are exhibited.

In each semiconductor device 1, the scribe region 2 is disposed between the cut portion 60 and the element formation region 3. In other words, the low-k film 17 is divided and discontinuous between the cut portion 60 and the element formation region 3. With this arrangement, the propagation of cracks produced in the cut portion 60 during the dicing step is stopped. Consequently, cracks are inhibited from reaching the element formation regions 3, and the yield of the semiconductor devices 1 is improved.

Second Embodiment

Next, a second embodiment will be described using FIGS. 5, 8, and 9. Elements shared in common with the first embodiment are denoted with similar signs, and a detailed description is omitted. First, a method of manufacturing a semiconductor device according to the second embodiment is described below. In the method of manufacturing a semiconductor device according to the second embodiment, first, the step illustrated in FIG. 5 of the first embodiment is performed.

Figure 8:
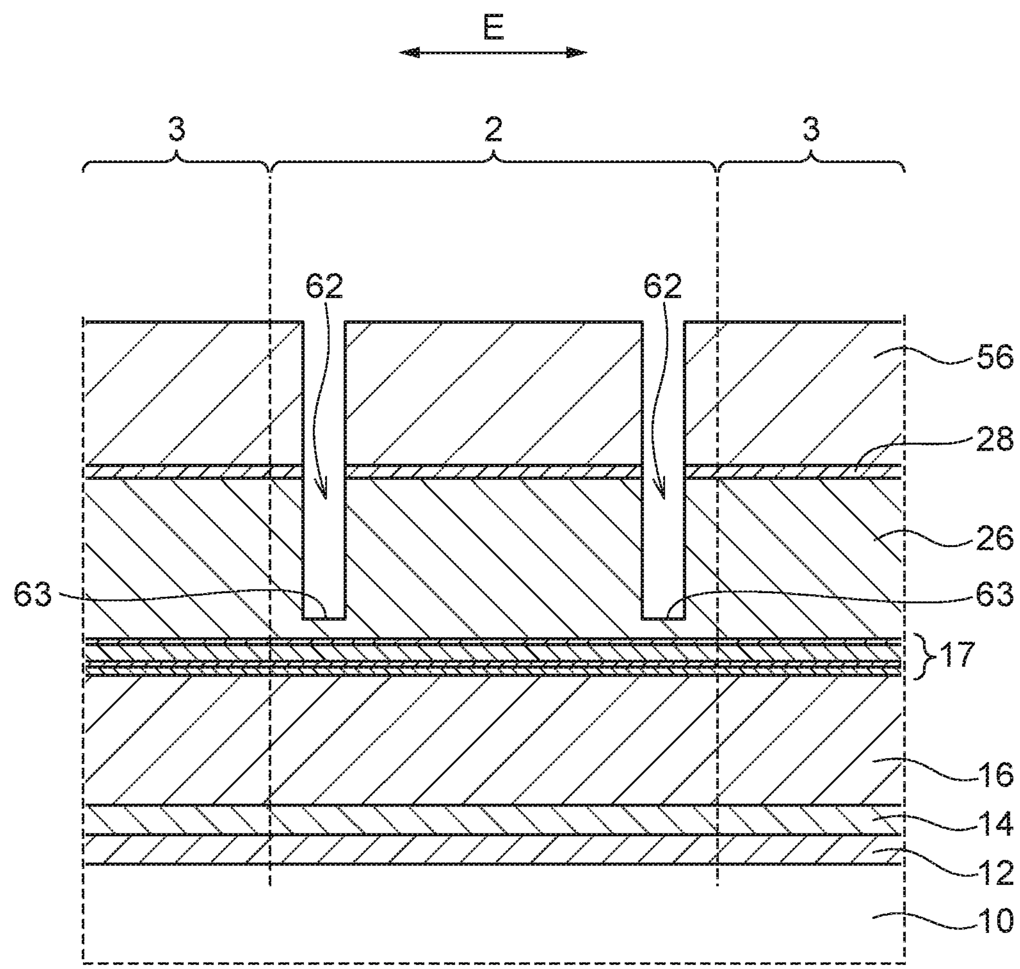
FIG. 8 is a longitudinal section illustrating one example of a step partway through a method or manufacturing a semiconductor device according to a second embodiment.

Next, as illustrated in FIG. 8, a photoresist 56 patterned to leave open space above the formation region of the groove 6 is formed. Next, anisotropic dry etching is performed by using the photoresist 56 as a mask. With this arrangement, the etching of the formation region of the groove 6 proceeds through the third insulating film 28 and partway through the second insulating film 26, forming a groove 62. The groove 62 does not penetrate the low-k film 17. The bottom of the groove 62 is positioned above the low-k film 17. The depth of the groove 62 can be controlled by setting an appropriate etching time, for example. The depth of the groove 6 can also be controlled by deciding when to stop etching by monitoring changes in the composition of the etching reaction gas, for example.

Figure 9:
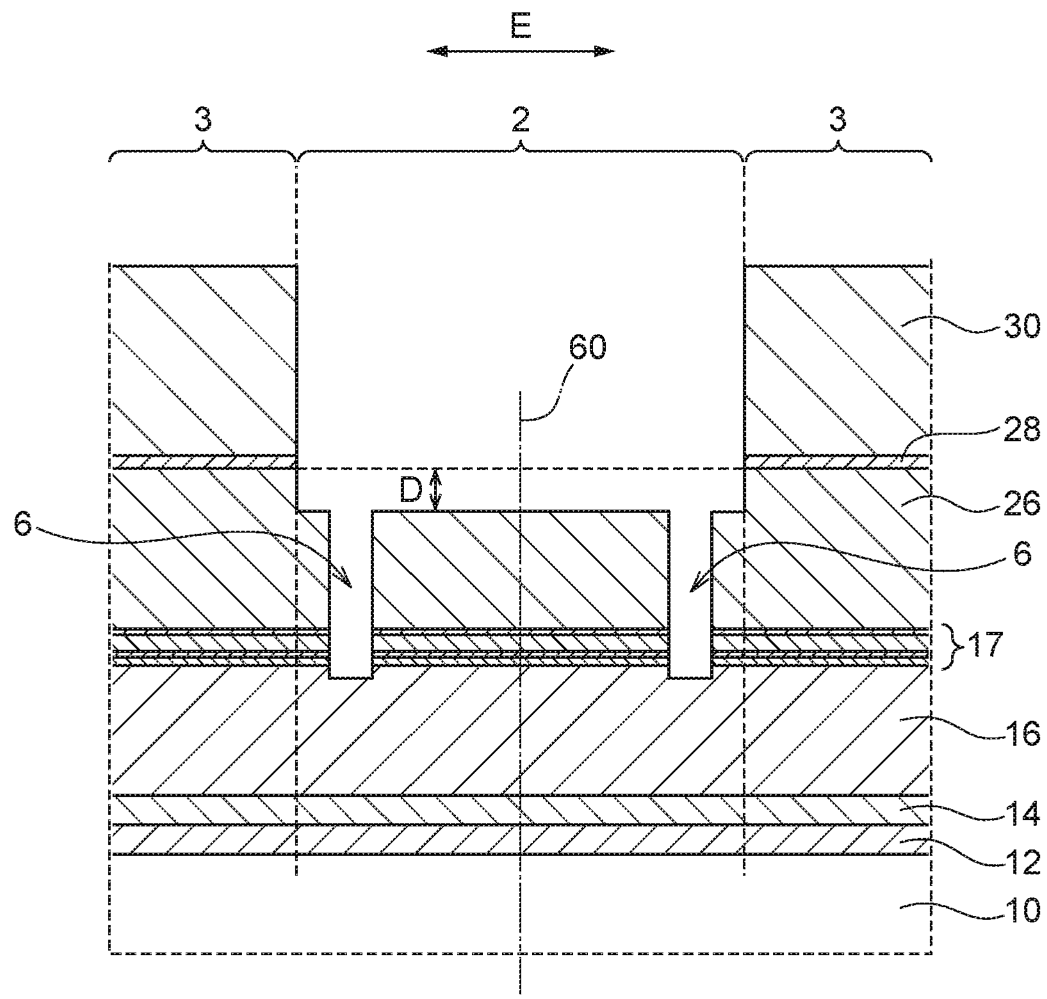
FIG. 9 is longitudinal section illustrating one example of a step partway through the method of manufacturing a semiconductor device according to the second embodiment, and is a diagram illustrating one example of a step following FIG. 8.

Next, as illustrated in FIG. 9, the photoresist 56 is removed, and after that, the polyimide film 30 patterned to leave open space above the scribe region 2 is formed. Next, dry etching is performed by using the polyimide film 30 as a mask. In this etching step, in the groove 62, the third insulating film 28 and part of the second insulating film 26 have already been etched away, and therefore the remaining part of the second insulating film 26, the low-k film 17, and a portion of the first insulating film 16 are etched. With this arrangement, the groove 6 is formed. On the other hand, in the scribe region 2 outside the groove 62, the third insulating film 28 is removed, and subsequently the second insulating film 26 is etched. The top face of the second insulating film 26 in the scribe region 2 is positioned downward from the formation position of the third insulating film 28 by a depth D.

According to the above steps, the groove 6 is formed penetrating through the low-k film 17 and dividing the low-k film 17 in the width direction E. According to such steps, because the groove 6 having a relatively small aspect ratio exists when forming the polyimide film 30, the polyimide film 30 is less likely to remain inside the groove 6.

Next, like the first embodiment, the semiconductor substrate 10 is cut in the scribe region 2 by performing a dicing step. According to the above, individually separated semiconductor devices 1 like the one illustrated in FIG. 7A can be manufactured. After that, although not illustrated in the diagrams, each semiconductor device 1 can be assembled in a package to manufacture a semiconductor product ready for commercial distribution.

In each semiconductor device 1, the top face of the scribe region 2 is disposed downward from the third insulating film 28 by the depth D. Otherwise, the configuration is similar to the first embodiment. According to the second embodiment described above, effects similar to the first embodiment are obtained.

Third Embodiment

Figure 10:
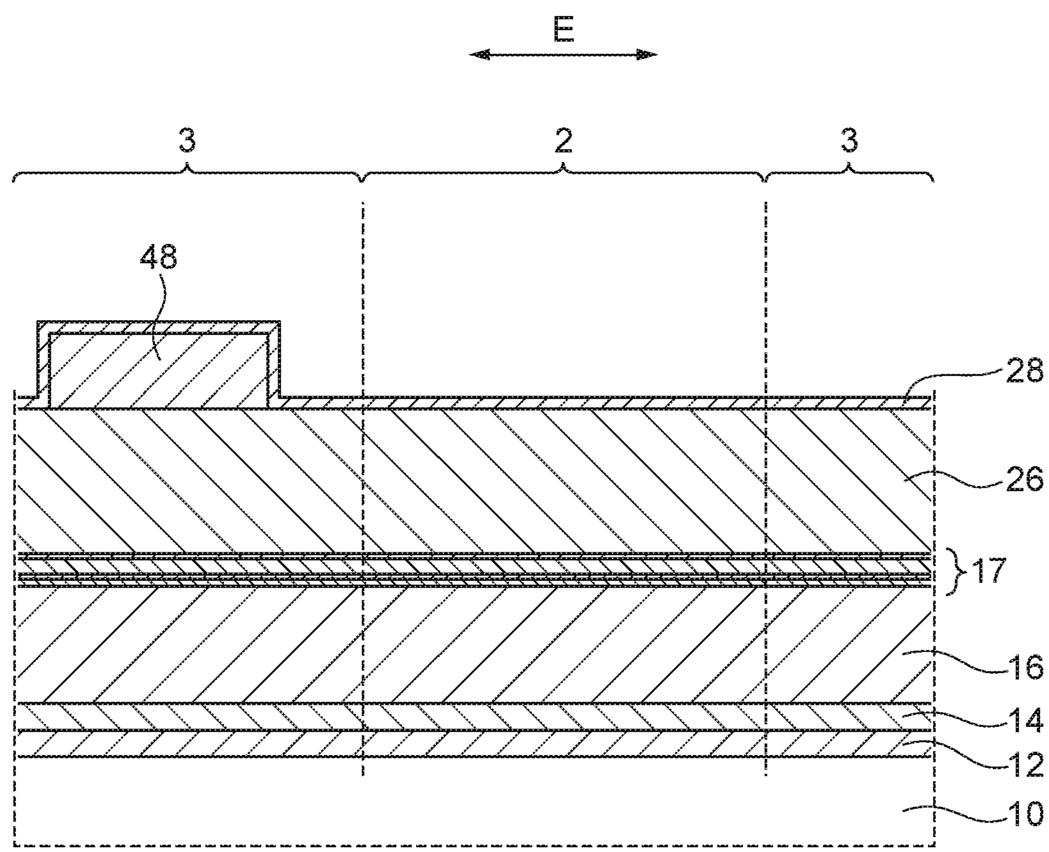
FIG. 10 is a longitudinal section illustrating one example of a step partway through a method of manufacturing the semiconductor device according to a third embodiment.

Next, a third embodiment will be described using FIGS. 10, 11, and 12. Elements shared in common with the first and second embodiments are denoted with similar signs, and a detailed description is omitted. Hereinafter, a method of manufacturing a semiconductor device according to the third embodiment will be described. In the method of manufacturing a semiconductor device according to the third embodiment, as illustrated in FIG. 10, the insulating film 12, the insulating film 14, the first insulating film 16, the low-k film 17, and the second insulating film 26 are formed on the semiconductor substrate 10. After that, a bonding pad 48 is formed on the second insulating film 26 of the element formation regions 3. The bonding pad 48 contains a metal such as aluminum (Al) for example. Next, the third insulating film 28 is formed on the second insulating film 26 and the bonding pad 48. Because the low-k film 17 is a stacked film of the low-k films 18, 20, 22, and 24, and because the low-k film 17 is formed between the metal interconnects 40, 42, and 44 in the element formation regions 3, in actuality, a step of forming the metal interconnects 40, 42, and 44 is also performed.

Figure 11:
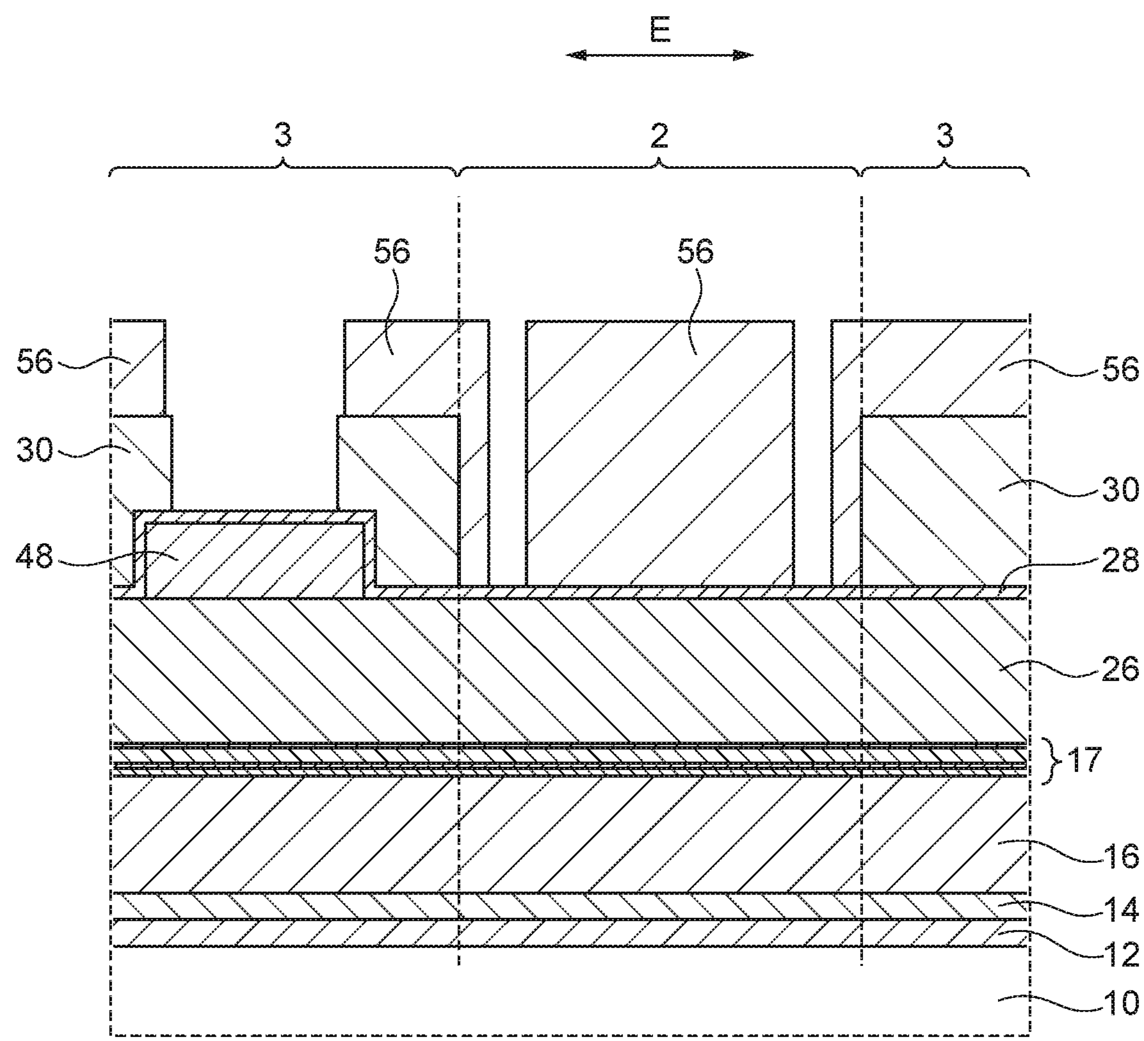
FIG. 11 is a longitudinal section illustrating one example of a step partway through the method of manufacturing a semiconductor device according to the third embodiment, and is a diagram illustrating one example of a step following FIG. 10.

Next, as illustrated in FIG. 11, the polyimide film 30 patterned to leave open space above the bonding pad 48 and above the scribe region 2 is formed. Thereafter, the photoresist 56 patterned to leave open space above the formation region of the groove 6 and above the bonding pad 48 is formed over the polyimide film 30.

Figure 12:
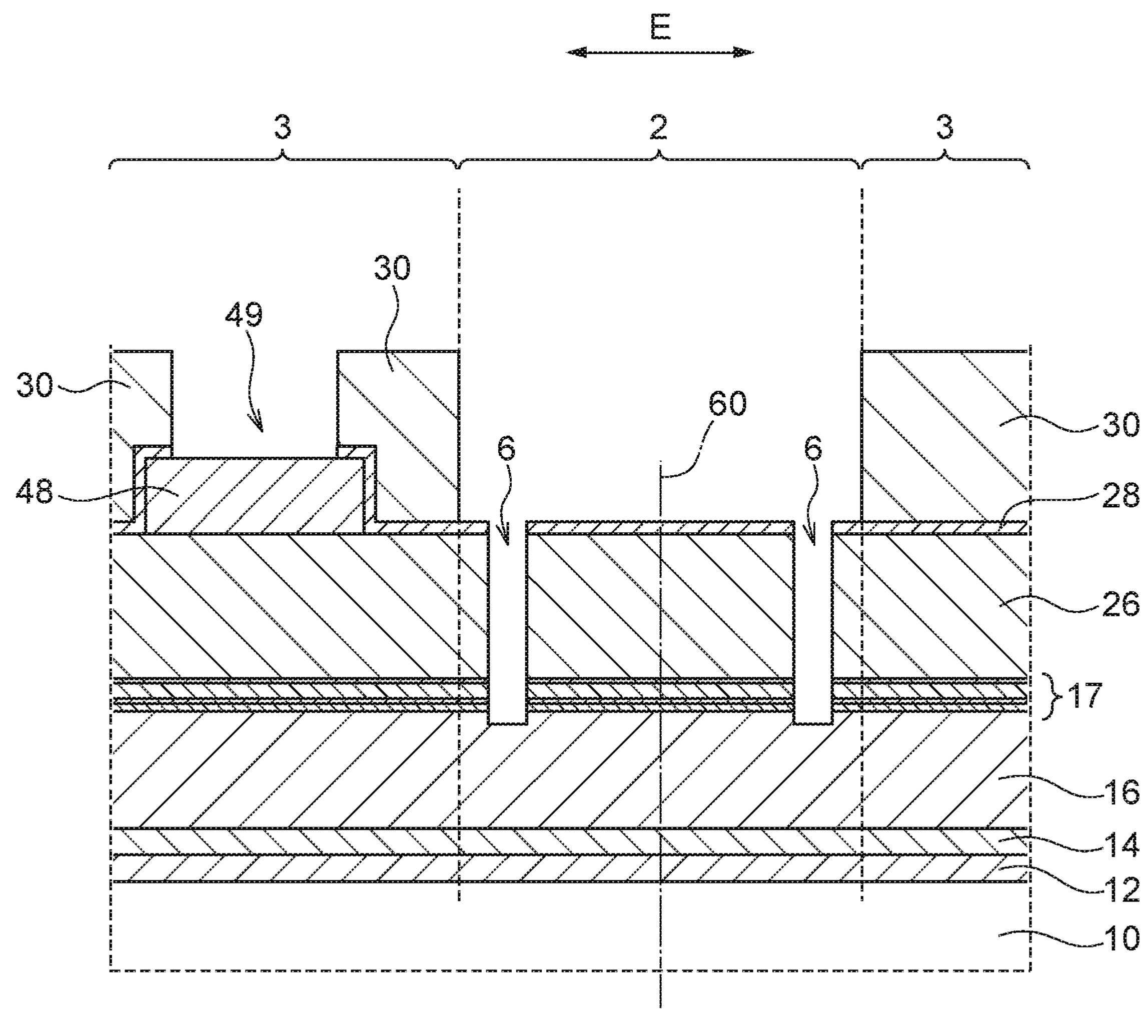
FIG. 12 is a longitudinal section illustrating one example of a step part ay through the method of manufacturing a semiconductor device according to the third embodiment, and is a diagram illustrating one example of a step following FIG. 11.

Next, as illustrated in FIG. 12, anisotropic dry etching is performed by using the photoresist 56 as a mask. With this etching, the third insulating film 28 on top of the bonding pad 48 is removed to form an opening 49 in the third insulating film 28, exposing the top face of the bonding pad 48. Meanwhile, in the scribe region 2, the third insulating film 28 over the groove 6 region is removed.

Furthermore, as the above etching continues, the etching does not advance into the bonding pad 48 because the bonding pad 48 is formed using a metal such as aluminum (Al) for example. On the other hand, in the groove 6 region, the etching advances past the third insulating film 28, successively removes the second insulating film 26, the low-k film 17, and a portion of the first insulating film 16, and the groove 6 is formed. The depth of the groove 6 can be controlled by setting an appropriate etching time, for example. The depth of the groove 6 can also be controlled by deciding when to stop etching by monitoring the etching reaction gas, for example.

Next, the photoresist 56 is removed, and the semiconductor substrate 10 is cut in the scribe region 2 by performing a dicing step. According to the above, individually separated semiconductor devices 1 like the one illustrated in FIG. 7A can be manufactured. After that, although not illustrated in the diagrams, by performing wire bonding on each bonding pad 48 and additionally assembling each semiconductor device 1 into a package, a semiconductor product ready for commercial distribution can be manufactured.

According to the third embodiment described above, effects similar to the first embodiment are obtained. Also, according to the third embodiment, because the step of forming the groove 6 and the step of forming the opening 49 above the bonding pad 48 can be performed at the same time, the number of steps for manufacturing the semiconductor devices 1 can be decreased, and the manufacturing costs for the semiconductor devices 1 can be reduced.

Fourth Embodiment

Next, a fourth embodiment will be described using FIGS. 10, 13, and 14. Elements shared in common with any of the first, second, and third embodiments are denoted with similar signs, and a detailed description omitted. Hereinafter, a method of manufacturing a semiconductor device according to the fourth embodiment will be described. In the method of manufacturing a semiconductor device according to the fourth embodiment, the configuration illustrated in FIG. 10 and described in the third embodiment is created.

Figure 13:
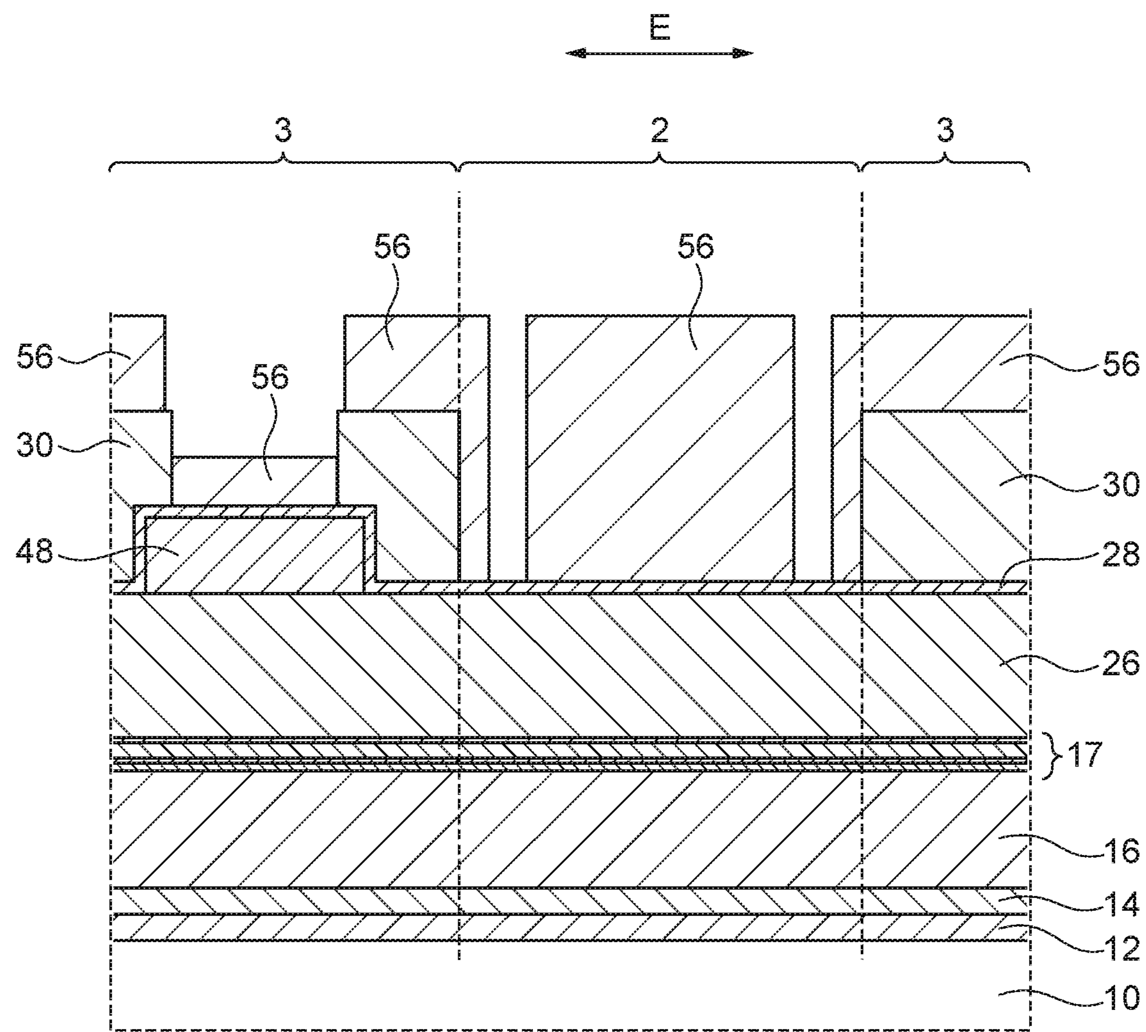
FIG. 13 is a longitudinal section illustrating one example of a step partway through a method of manufacturing the semiconductor device according to a fourth embodiment.

Next, as illustrated in FIG. 13, the polyimide film 30 patterned to leave open space above the bonding pad 48 and above the scribe region 2 is formed. Thereafter, the photoresist 56 patterned to leave open space above the formation region of the groove 6 is formed over the polyimide film 30. In this case, the photoresist 56 above the bonding pad 48 is formed with a thinner film thickness compared to other regions.

The technique described below can be used to form the thin photoresist 56 on the bonding pad 48. A light-shielding part of the exposure mask in the portion corresponding to the bonding pad 48 contains a halftone material. A halftone material is a material that partially transmits light. If such an exposure mask is used to expose the photoresist 56, the photoresist on the bonding pad 48 corresponding to the light-shielding part containing the halftone material is exposed less than the regions where the light-shielding part is not formed, and therefore a thin photoresist 56 can be formed. With this arrangement, a thin photoresist 56 can be formed on the bonding pad 48.

Figure 14:
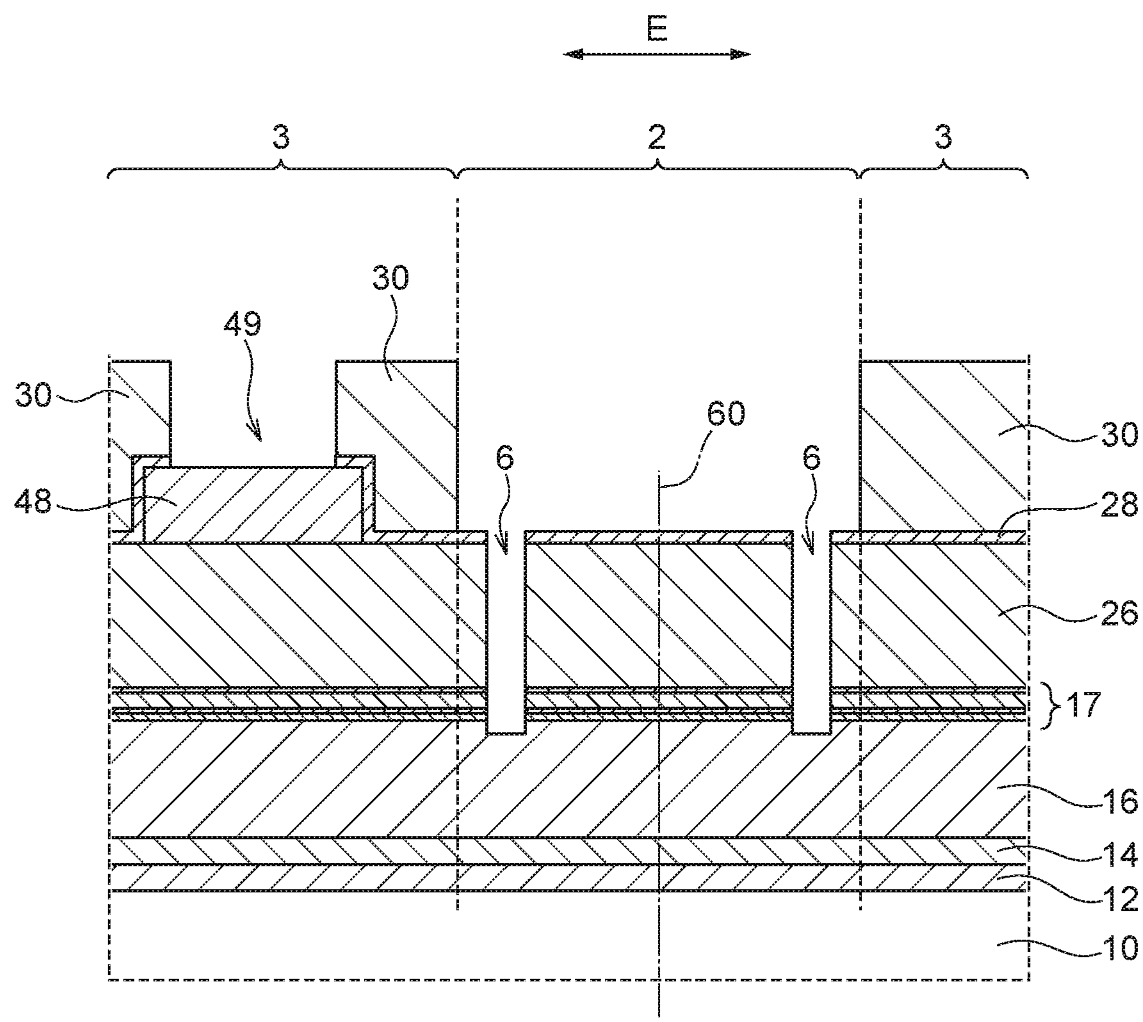
FIG. 14 is a longitudinal section illustrating one example of a step partway through the method of manufacturing a semiconductor device according to the fourth embodiment, and is a diagram illustrating one example of a step following FIG. 13.

Next, as illustrated in FIG. 14, anisotropic dry etching is performed by using the photoresist 56 as a mask. With the dry etching, the photoresist 56 on the bonding pad 48 is etched away and gradually decreases in film thickness. Subsequently, when the photoresist 56 on the bonding pad 48 is removed, the third insulating film 28 on the bonding pad 48 is removed by etching. With this arrangement, the opening 49 is formed above the bonding pad 48, exposing the top face of the bonding pad 48.

Meanwhile, in the scribe region 2, the etching advances because the photoresist 56 does not exist in the groove 6 region. In the groove 6 region, the etching advances past the third insulating film 28, successively removes the second insulating film 26, the low-k film 17, and a portion of the first insulating film 16, and the groove 6 is formed. The depth of the groove 6 can be controlled by setting an appropriate etching time, for example. The depth of the groove 6 can also be controlled by deciding when to stop etching by monitoring the etching reaction gas, for example.

Next, the photoresist 56 is removed, and the semiconductor substrate 10 is cut in the scribe region 2 by performing a dicing step. According to the above, individually separated semiconductor devices 1 like the one illustrated in FIG. 7A can be manufactured. After that, although not illustrated in the diagrams, by performing wire bonding on each bonding pad 48 and additionally assembling each semiconductor device 1 into a package, a semiconductor product ready for commercial distribution can be manufactured.

According to the fourth embodiment described above, effects similar to the third embodiment are obtained. Also, according to the fourth embodiment, because the top of the bonding pad 48 is protected by the photoresist 56 during the step of forming the groove 6, the top face of the bonding pad

48 is exposed to the etching environment for a shorter length of time. For this reason, etching damage to the bonding pad 48 can be reduced. Also, because the transfer of electric charge from the etching environment to the bonding pad 48 can be suppressed, phenomena such as dielectric breakdown of the bonding pad 48 and elements connected to the bonding pad 48 can be suppressed, and the yield of the semiconductor devices 1 can be improved.

Fifth Embodiment

Figure 15:
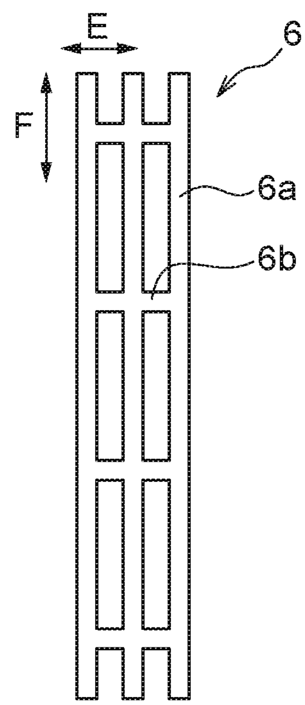
FIG. 15 is a plan view illustrating one example of a schematic configuration of a groove formed in the scribe region.
Figure 16:
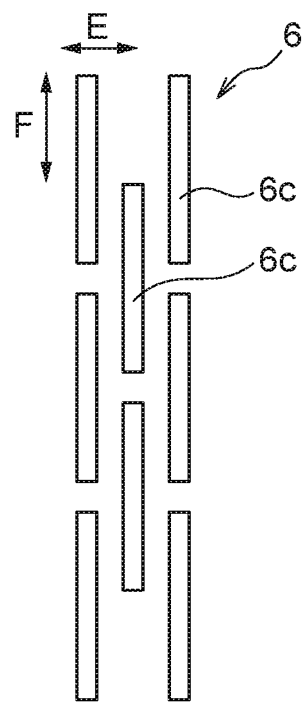
FIG. 16 is a plan view illustrating one example of a schematic configuration of a groove formed in the scribe region.
Figure 17:
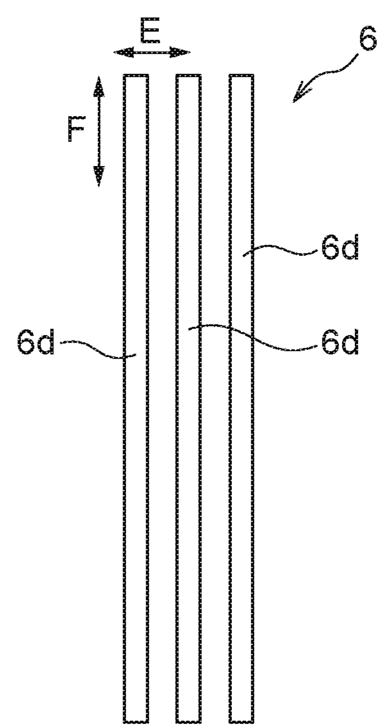
FIG. 17 is a plan view illustrating one example of a schematic configuration of a groove formed in the scribe region.

Next, a fifth embodiment will be described using FIGS. 15, 16, and 17. In the semiconductor device 1 according to the fifth embodiment, three exemplary configurations of the groove 6 are disclosed. As a first exemplary configuration, the groove 6 may have a configuration combining three narrow grooves 6*a* extending in the longitudinal direction and narrow grooves 6*b* extending in the width direction E to form a ladder shape, as illustrated in FIG. 15. As a second exemplary configuration, the groove 6 may have a configuration in which narrow grooves 6*c* provided with a predetermined length in the longitudinal direction F are combined in a staggered arrangement, as illustrated in FIG. 16. As a third exemplary configuration, the groove 6 may include three narrow grooves 6*d* extending in the longitudinal direction F. Each of the narrow grooves 6*a*, 6*b*, 6*c*, and 6*d* illustrated in the above three examples is configured to penetrate through the low-k film 17 and divide the low-k film 17 in the width direction E.

In the first to fourth embodiments, the groove 6 includes a single, wide groove. In contrast, in the fifth embodiment, the groove 6 includes a combination of a plurality of narrow grooves 6*a*, 6*b*, 6*c*, and 6*d* having a short width. In this way, according to the fifth embodiment, in the element formation regions 3, the groove 6 is configured such that the plurality of narrow grooves 6*a*, 6*b*, 6*c*, and 6*d* are disposed in the width direction E. By adopting such a configuration, the plurality of narrow grooves 6*a*, 6*b*, 6*c*, and 6*d* divide the low-k film 17 in the region from the cut portion 60 to the element formation regions 3. According to this configuration, it is possible to increase the chance of deterring cracks produced in the cut portion 60 from propagating to the element formation regions 3. Consequently, the propagation of cracks produced in the cut portion 60 to the element formation regions 3 can be suppressed further.

As above, DRAM is described as an example of the semiconductor device 1 according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device 1. Furthermore, devices other than memory, including logic ICs such as a microprocessor and an application-specific integrated circuit (ASIC) for example are also applicable as the semiconductor device 1 according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method of manufacturing a semiconductor device including a plurality of element formation regions arranged in a matrix and a scribe region provided between the element formation regions, the method comprising:

forming a first insulating film;

forming a low-k film on the first insulating film;

forming a second insulating film on the low-k film; and forming a groove penetrating through the second insulating film and the low-k film and into the first insulating film in the scribe region in proximity to the element formation regions, wherein a bottom of the groove is positioned below the low-k film and partway in the first insulating film below the low-k film.

2. The method of claim 1, wherein the scribe region has a predetermined width in a first direction, and the groove is located at an edge of the scribe region in the first direction and extends in a second direction that is orthogonal to the first direction.

3. The method of claim 1, wherein the groove comprises a plurality of grooves having a width smaller than that of the groove.

4. The method of claim 1, wherein the low-k film comprises a stacked film of a plurality of low-k films.

5. The method of claim 1, wherein a plurality of interconnects are provided in the element formation regions, and the low-k film is formed between the plurality of interconnects.

6. The method of claim 1, wherein the low-k film comprises a stacked film of SiOC and SiCN.

7. The method of claim 1, wherein the first insulating film and the second insulating film comprise silicon oxide films.

8. A method of manufacturing a semiconductor device including a plurality of element formation regions arranged in a matrix and a scribe region provided between the element formation regions, the method comprising:

forming a first insulating film;

forming a low-k film;

forming a second insulating film;

forming a third insulating film on the second insulating film;

forming a groove having a depth that does not reach an upper surface of the low-k film at an edge of the scribe region adjacent to the element formation regions;

forming a cover film patterned to leave open space above the scribe region; and performing anisotropic dry etching to remove the third insulating film, and furthermore until the groove penetrates through the low-k film in the scribe region using the cover film as a mask.

9. The method of claim 8, wherein the scribe region has a predetermined width in a first direction, and the groove is located at an edge of the scribe region and extends in a second direction that is orthogonal to the first direction.

10. The method of claim 8, wherein the groove comprises a plurality of grooves having a width smaller than that of the groove.

11. The method of claim 8, wherein the low-k film comprises a stacked film of a plurality of low-k films.

12. The method of claim 8, wherein a plurality of interconnects included in the semiconductor device are provided in the element formation region, and the low-k film is formed between the plurality of interconnects.

13. The method of claim 8, wherein the low-k film comprises a stacked film of SiOC and SiCN.

14. The method of claim 8, wherein the first insulating film and the second insulating film comprise silicon oxide films.

* * * * *